United States Patent
Baek et al.

(10) Patent No.: US 10,910,071 B2
(45) Date of Patent: Feb. 2, 2021

(54) VOLTAGE GENERATOR AND METHOD OF OPERATING THE SAME

(71) Applicant: Samsung Electronics Co., Ltd., Suwon-si (KR)

(72) Inventors: Se-heon Baek, Seoul (KR); Ki-chang Jang, Yongin-si (KR); Dae-seok Byeon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/507,205

(22) Filed: Jul. 10, 2019

(65) Prior Publication Data

US 2020/0185041 A1   Jun. 11, 2020

(30) Foreign Application Priority Data

Dec. 7, 2018 (KR) ................. 10-2018-0157473

(51) Int. Cl.

| G11C 16/30 | (2006.01) |
| G11C 16/08 | (2006.01) |
| G05F 1/575 | (2006.01) |
| H02M 1/08 | (2006.01) |
| G11C 5/14 | (2006.01) |
| H02M 1/00 | (2006.01) |
| G11C 16/04 | (2006.01) |
| H02M 3/07 | (2006.01) |
| G11C 13/00 | (2006.01) |
| G11C 11/16 | (2006.01) |

(52) U.S. Cl.
CPC .............. *G11C 16/30* (2013.01); *G05F 1/575* (2013.01); *G11C 5/145* (2013.01); *G11C 16/08* (2013.01); *H02M 1/08* (2013.01); *G11C 5/147* (2013.01); *G11C 5/148* (2013.01); *G11C 11/1697* (2013.01); *G11C 13/0038* (2013.01); *G11C 16/0483* (2013.01); *H02M 3/07* (2013.01); *H02M 2001/0009* (2013.01)

(58) Field of Classification Search
CPC ............ G11C 16/30; G11C 16/08; G11C 5/14
See application file for complete search history.

(56) References Cited

U.S. PATENT DOCUMENTS

| 5,903,452 A | 5/1999 | Yang |
| 7,855,535 B2 | 12/2010 | Tiew et al. |
| 7,911,808 B2 | 3/2011 | Huynh et al. |
| 8,686,767 B1 | 4/2014 | Nene |
| 9,577,509 B2 | 2/2017 | Wang et al. |
| 9,614,517 B2 | 4/2017 | Krishna |

(Continued)

*Primary Examiner* — Mushfique Siddique
(74) *Attorney, Agent, or Firm* — Harness, Dickey & Pierce, P.L.C.

(57) ABSTRACT

There are provided a method of operating a voltage generator. The method includes providing a reference voltage, sensing a magnitude of a charge current for increasing voltages of a plurality of word lines based on the reference voltage, determining whether the sensed magnitude of the charge current is greater than a peak current value, increasing the reference voltage in accordance with a first slope when the sensed magnitude of the charge current is less than or equal to the peak current value, and increasing the reference voltage in accordance with a second slope less than the first slope when the detected magnitude of the charge current is greater than the peak current value.

20 Claims, 15 Drawing Sheets

(56) References Cited

U.S. PATENT DOCUMENTS

| | | | |
|---|---|---|---|
| 9,712,041 B2 | 7/2017 | Pagano | |
| 2009/0256545 A1 | 10/2009 | Wang et al. | |
| 2010/0074034 A1* | 3/2010 | Cazzaniga | G11C 5/147 |
| | | | 365/189.09 |
| 2012/0218817 A1* | 8/2012 | Kang | G11C 16/06 |
| | | | 365/185.2 |
| 2015/0214827 A1* | 7/2015 | Yoon | H02M 3/1588 |
| | | | 323/286 |
| 2015/0309737 A1* | 10/2015 | Kim | G11C 11/5642 |
| | | | 711/103 |
| 2016/0125939 A1* | 5/2016 | Park | G11C 11/1673 |
| | | | 365/148 |
| 2017/0063076 A1 | 3/2017 | Hou et al. | |
| 2017/0316833 A1* | 11/2017 | Ihm | G11C 7/062 |
| 2019/0393783 A1* | 12/2019 | Luo | H02M 3/157 |
| 2020/0111513 A1* | 4/2020 | Baek | G11C 5/145 |

\* cited by examiner

VOLTAGE GENERATOR AND METHOD OF OPERATING THE SAME

CROSS-REFERENCE TO RELATED APPLICATION

This application claims the benefit of Korean Patent Application No. 10-2018-0157473, filed on Dec. 7, 2018, in the Korean Intellectual Property Office, the disclosure of which is incorporated herein in its entirety by reference.

BACKGROUND

The inventive concepts relate to a voltage generator.

A semiconductor memory device is implemented by using a semiconductor such as silicon (Si), germanium (Ge), gallium arsenide (GaAs), or indium phosphide (InP). The semiconductor memory device may be classified into a volatile memory device and a non-volatile memory device.

When using a vertical-NAND flash memory having a stacked structure, as the number of stacked word lines increases, parasitic capacitance increases and a peak current may be generated between the word lines. When the magnitude of a word line charge current is maintained in order to maintain the performance of memory, an erroneous operation of a memory device may be caused by the peak current. When the magnitude of the word line charge current is reduced in order to prevent the peak current from being generated, a word line setup time may increase and the performance of the memory device may deteriorate.

SUMMARY

The inventive concepts provide a voltage generator for variably controlling a slope of a word line charge voltage by sensing a charge current input to a word line and a method of operating the same.

The inventive concepts also provide a voltage generator for identifying the charge of a word line by using a sensing value of a charge current although standby time previously determined in order to charge a word line does not pass and rapidly performing a standby process and a method of operating the same.

According to an aspect of the inventive concepts, there is provided a voltage generator including at least one driving circuit, a current sensing unit, a peak detect unit, and a slope control unit. The at least one driving circuit connected to a plurality of word lines of a memory device. The at least one driving circuit configured to provide a current for increasing voltages of the plurality of word lines based on a reference voltage. The current sensing unit configured to detect a magnitude of a charge current input to the at least one driving circuit. The peak detect unit configured to compare the detected magnitude of the charge current with a peak current value. The slope control unit configured to provide the reference voltage to the at least one driving circuit, increasing the reference voltage in accordance with a first slope when the detected magnitude of the charge current is less than or equal to the peak current value, and increase the reference voltage in accordance with a second slope less than the first slope when the detected magnitude of the charge current is greater than the peak current value.

According to an aspect of the inventive concepts, there is provided a method of operating a voltage generator. The method includes providing a reference voltage, sensing a magnitude of a charge current for increasing voltages of a plurality of word lines based on the reference voltage, determining whether the sensed magnitude of the charge current is greater than a peak current value, increasing the reference voltage in accordance with a first slope when the sensed magnitude of the charge current is less than or equal to the peak current value, and increasing the reference voltage in accordance with a second slope less than the first slope when the detected magnitude of the charge current is greater than the peak current value.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
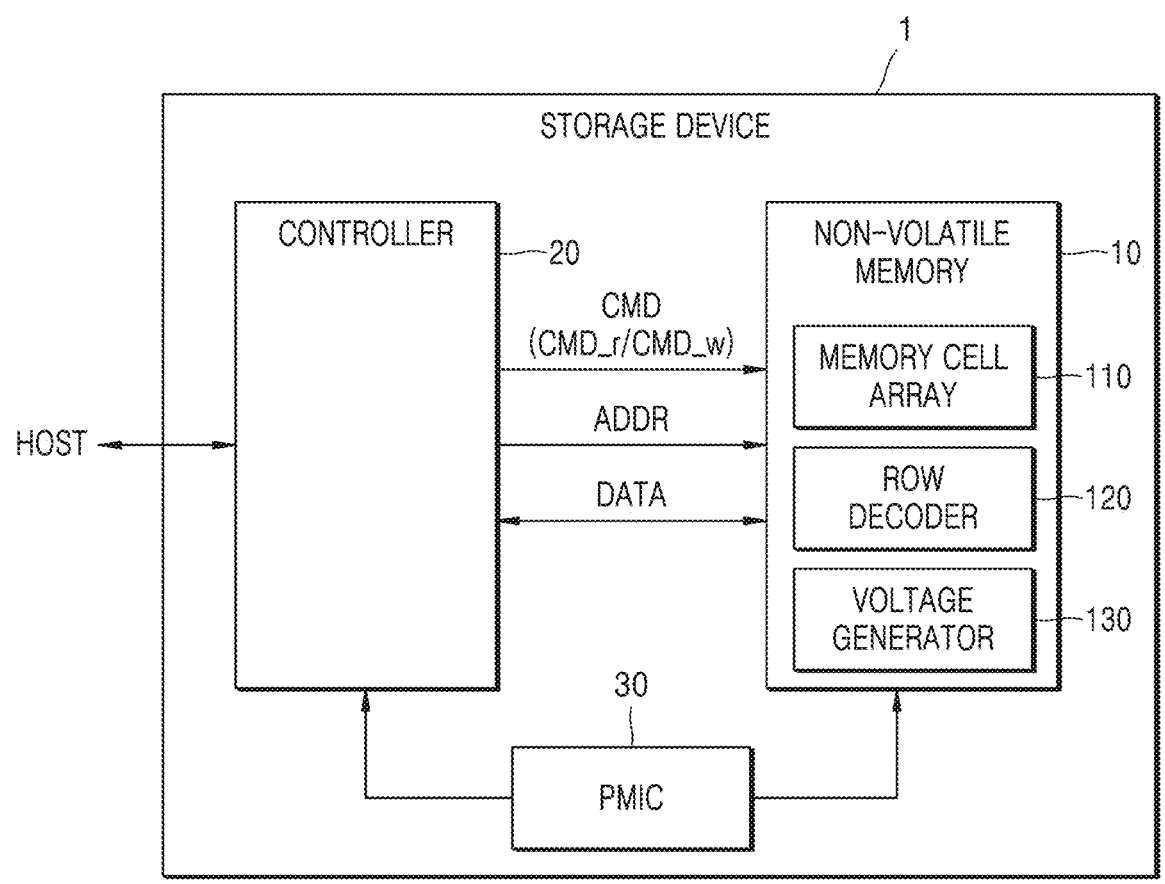
FIG. 1 is a block diagram illustrating a storage device according to an example embodiment of the inventive concepts.

FIG. 1 is a block diagram illustrating a storage device 1 according to an example embodiment of the inventive concepts.

Referring to FIG. 1, the storage device 1 may include a non-volatile memory device 10, a memory controller 20, and a power management integrated circuit (PMIC) 30. In an example, each of a host HOST, the memory controller 20, and the non-volatile memory device 10 may be provided as a chip, a package, or a module. Alternatively, the memory controller 20 and the non-volatile memory device 10 may be provided by using packages such as a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flatpack (TQFP), a system in package (SIP), a multichip package (MCP), a wafer-level fabricated package (WFP), and a wafer-level processed stack package (WSP).

The memory controller 20 may control the non-volatile memory device 10 in response to a write request or a read request received from the host HOST. For example, the memory controller 20 may transmit a command CMD and an address ADDR to the non-volatile memory device 10 in response to the write request or the read request received from the host HOST. The address ADDR transmitted by the memory controller 20 to the non-volatile memory device 10 may be a physical address of the non-volatile memory device 10. The memory controller 20 may transmit data DATA to and receive data DATA from the non-volatile memory device 10. In an example, when the command CMD is a write command CMD_w, the non-volatile memory device 10 may write the data DATA received from the memory controller 20 in a memory cell array 110 and, when the command CMD is a read command CMD_r, the non-volatile memory device 10 may output the data DATA stored in the address ADDR received from the memory controller 20 to the memory controller 20. The memory controller 20 may be implemented within the storage device 1 as hardware or software or in the form of a combination of hardware and software.

The PMIC 30 may provide power to the non-volatile memory device 10 and the memory controller 20. According to various example embodiments, the PMIC 30 receives main power from an external power supply and may convert the received main power into power requested by each of the non-volatile memory device 10 and the memory controller 20. For example, when the non-volatile memory device 10 performs a data write command, the PMIC 30 may provide a high voltage (for example, 40V) to the non-volatile memory device 10. In another example, when the non-volatile memory device 10 performs a data read command, the PMIC 30 may provide a low voltage (for example, 12V) to the non-volatile memory device 10.

According to various example embodiments, the non-volatile memory device 10 may include the memory cell array 110, a row decoder 120, and a voltage generator 130. The memory cell array 110 may include a plurality of memory cells. For example, the plurality of memory cells may be flash memory cells. Hereinafter, example embodiments will be described in detail taking a case in which a plurality of memory cells are NAND flash memory cells as an example. However, the spirit of the inventive concepts is not limited thereto. In another example embodiment, the plurality of memory cells may be resistive memory cells such as resistive random access memory (RRAM), phase change RAM (PRAM), and magnetic RAM (MRAM).

According to an example embodiment, the memory cell array 110 may be a three-dimensional (3D) memory cell array. The 3D memory cell array is monolithically formed in an active region arranged on a silicon substrate and at at least one physical level of memory cell arrays having a circuit formed on the silicon substrate or in the silicon substrate as a circuit related to operations of memory cells. The term "monolithic" means that layers of each level that configures the 3D memory cell array are stacked on layers of each lower level in the memory cell array. The 3D memory cell array includes NAND strings arranged in a vertical direction so that at least one memory cell is positioned on another memory cell. The at least one memory cell may include a charge trap layer. However, the inventive concepts re not limited thereto. In another example embodiment, the memory cell array 110 may be a 2D memory cell array. In the U.S. Pat. Nos. 7,679,133, 8,553,466, 8,654,587, and 8,559,235 and the U.S. Patent Publication No. 2011/0233648, proper configurations of the 3D memory cell array formed of a plurality of levels, in which word lines and/or bit lines are shared among levels, are described in detail. The U.S. Pat. Nos. 7,679,133, 8,553,466, 8,654,587, and 8,559,235 and the U.S. Patent Publication No. 2011/0233648 are incorporated herein by reference. In addition, the U.S. Patent Publication Nos. 2014-0334232 and 8,488,381 are incorporated herein by reference.

According to an example embodiment, the row decoder 120 may select partial word lines among word lines WL in response to address X-ADDR information. The row decoder 120 transmits a word line voltage VWL to the word lines WL. During a program operation, the row decoder 120 may apply a program voltage and a verify voltage to the selected word lines and may apply a program inhibit voltage to non-selected word lines. During a read operation, the row decoder 120 may apply a read voltage to the selected word lines and may apply a read inhibit voltage to the non-selected word lines. During a recovery operation, the row decoder 120 may apply a recovery voltage to the selected word lines. In addition, the row decoder 120 may select partial string selection lines among string selection lines or partial ground selection lines among ground selection lines in response to the address ADDR information.

According to an example embodiment, the voltage generator 130 may generate various kinds of voltages for performing write, read, and erase operations on the memory cell array 110 based on a voltage control signal Ctrl_vol. In detail, the voltage generator 130 may generate the word line voltage VWL, for example, the program voltage (or a write voltage), the read voltage, a pass voltage (or a word line non-selection voltage), the verify voltage, or the recovery voltage.

On the other hand, the storage device 1 may be implemented by one of various kinds of storage devices such as a solid state drive (SSD), an embedded multimedia card (eMMC), an MMC, a universal flash storage (UFS), an embedded UFS, a reduced size MMC (RS-MMC), an MMC in the form of a micro-MMC, a compact flash (CF) card, a secure digital (SD) card, a micro-secure digital (SD) card, a mini-SD card, an extreme digital (xD) card, a smart media card, and a memory stick.

The storage device 1 may be embedded in an electronic device or may be attached to and detached from an electronic device. The electronic device may be implemented by, for example, a personal computer (PC), a data server, an ultra-mobile PC (UMPC), a workstation, a netbook, a network-attached storage (NAS), a smart television, an Internet of things (IoT) device, or a portable electronic device. The portable electronic device may be a laptop computer, a mobile telephone, a smart phone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, or a wearable device.

Figure 2:
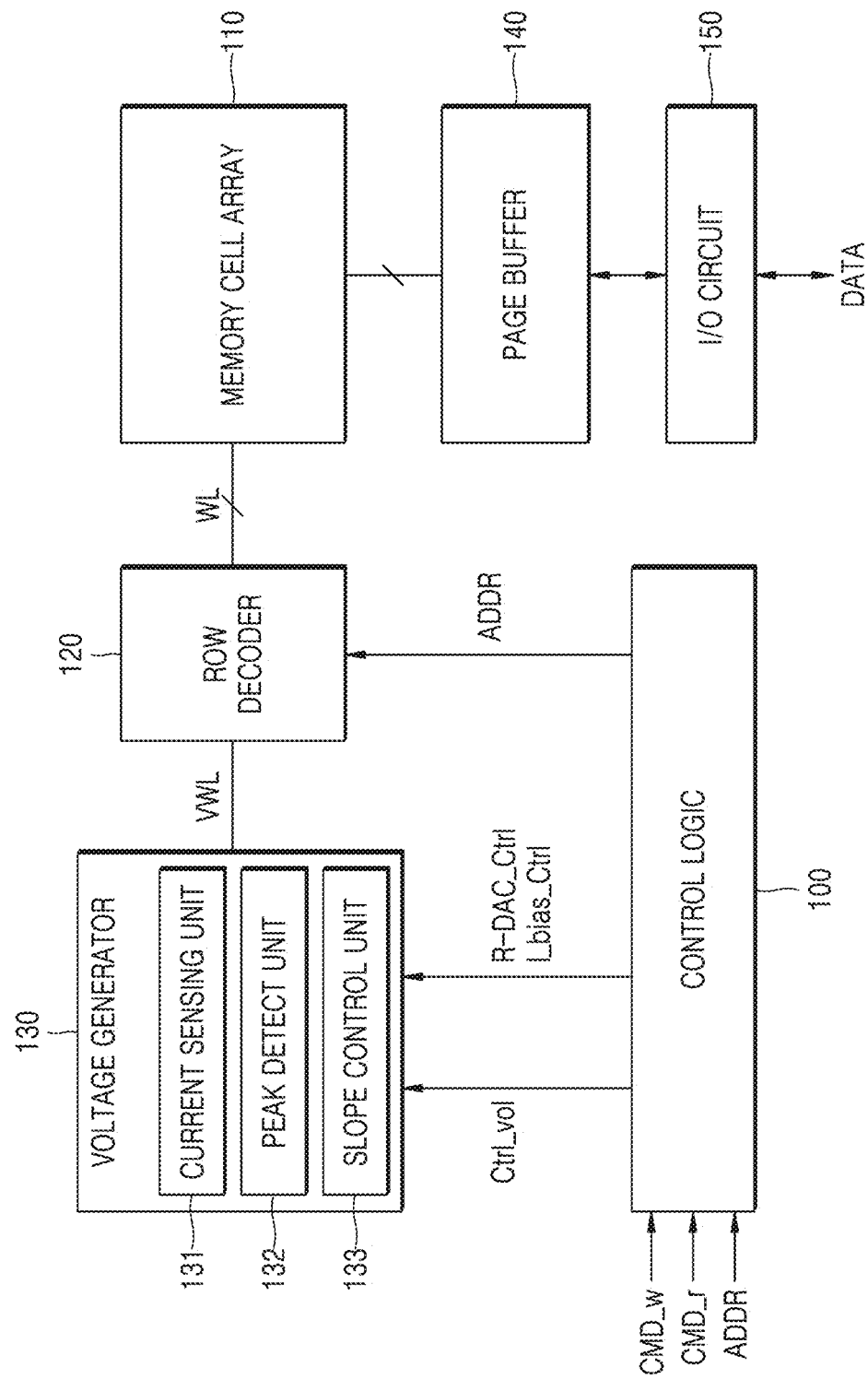
FIG. 2 is a block diagram illustrating a non-volatile memory device according to an example embodiment of the inventive concepts.

FIG. 2 is a block diagram illustrating a non-volatile memory device 10 according to an example embodiment of the inventive concepts. Descriptions that are the same as that of FIG. 1 may be omitted.

Referring to FIG. 2, the non-volatile memory device 10 may include a control logic 100, the memory cell array 110, the row decoder 120, the voltage generator 130, a page buffer 140, and an input/output circuit 150.

According to various example embodiments, the control logic 100 may output various control signals for writing data in the memory cell array 110 or reading data from the memory cell array 110 based on the commands CMD_w/CMD_r and the address ADDR that are received from the memory controller (20 of FIG. 1). According to an example embodiment, the control logic 100 may transmit a plurality of control signals to the voltage generator 130. For example, the control logic 100 may transmit a resistor digital-analog converter (R-DAC) control signal R-DCA_Ctrl or a current source bias control signal $I_{bias}$_Ctrl to the voltage generator 130. The control logic may be implemented within the non-volatile memory device 10 as hardware or software or in the form of a combination of hardware and software.

According to an example embodiment, the voltage generator 130 may further include a current sensing unit 131, a peak detect unit 132, and a slope control unit 133. The current sensing unit 131 may sense a magnitude of a current. For example, the current sensing unit 131 may sense a magnitude of a charge current input in order to charge a plurality of word lines.

The peak detect unit 132 may detect whether the magnitude of the charge current is greater than a peak current value. The peak detect unit 132 may determine whether the magnitude of the charge current is greater than the peak current value by using a comparator. For example, the peak detect unit 132 receives a value obtained by sensing the charge current from the current sensing unit 131 and may compare the sensed value with the peak current value.

The slope control unit 133 may control a reference voltage input to at least one driving circuit based on whether the magnitude of the charge current is greater than the peak current value. For example, when the magnitude of the charge current is greater than the peak current value, the slope control unit 133 may reduce a slope of the reference voltage. When the slope of the reference voltage is reduced, the magnitude of the charge current may be reduced. In another example, when the magnitude of the charge current is less than the peak current value, the slope control unit 133 may increase the slope of the reference voltage. When the slope of the reference voltage increases, the magnitude of the charge current may increase. The current sensing unit 131, the peak detect unit 132, and the slope control unit 133 that are included in the voltage generator 130 will be described in detail in FIG. 6.

According to an example embodiment, the page buffer 140 may include a write driver and a sense amplifier. During a write operation, the page buffer 140 may transmit a bit line voltage corresponding to data to be written in a bit line of the memory cell array 110. During the read operation or a verify operation, the page buffer 140 may sense data stored in a selected memory cell via the bit line. The page buffer 140 may include a plurality of latch sets (not shown) connected to one or two bit lines.

According to an example embodiment, the input and output circuit 150 receives data from the outside (for example, the memory controller 20) and stores the input data in the memory cell array 110. In addition, the input and output circuit 150 reads the data from the memory cell array 110 and may output the read data to the outside.

Figure 3:
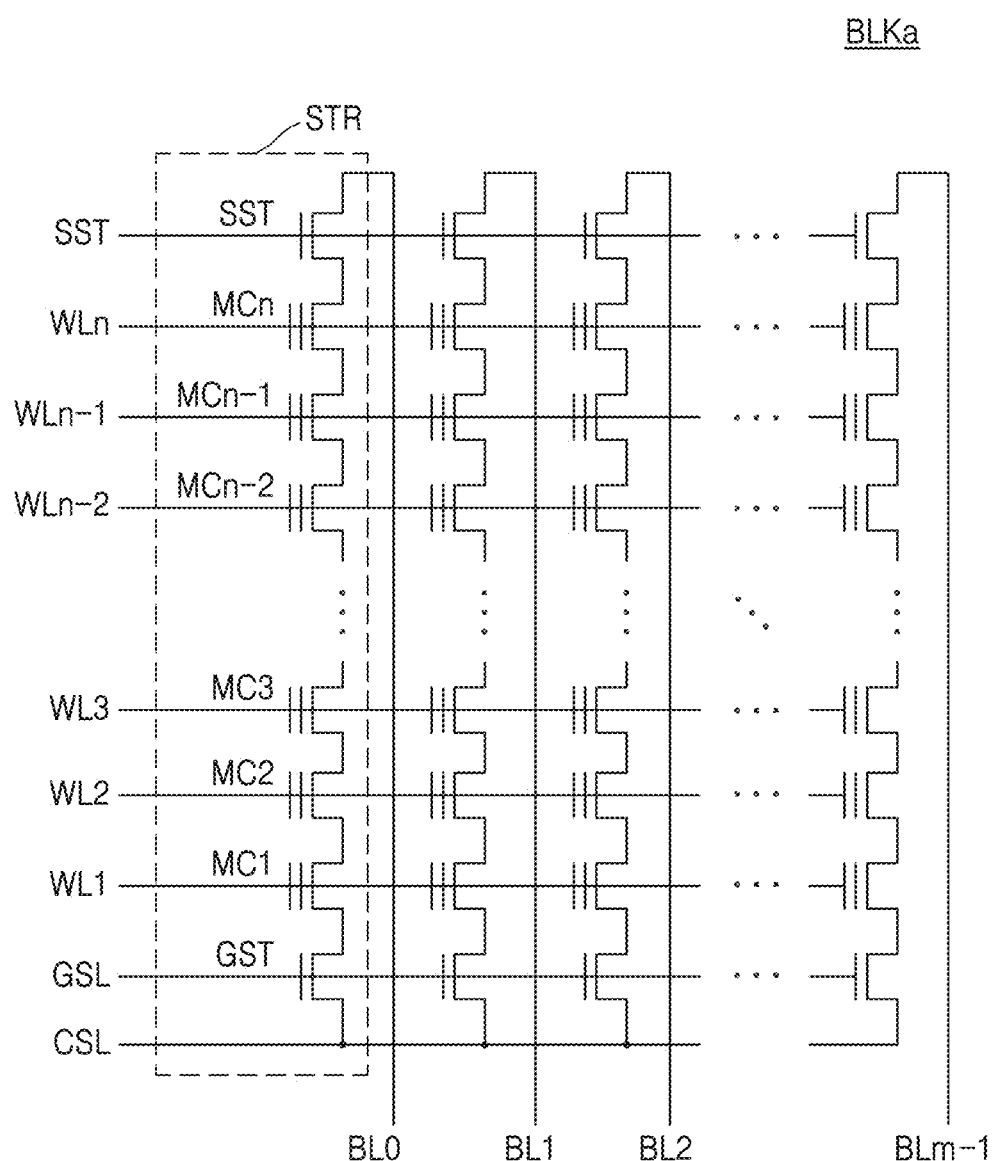
FIG. 3 is a circuit diagram illustrating a memory block included in a memory cell array according to an example embodiment of the inventive concepts.

FIG. 3 is a circuit diagram illustrating a memory block included in a memory cell array 110 according to an example embodiment of the inventive concepts.

Referring to FIG. 3, the memory cell array (for example, 110 of FIG. 2) may be a memory cell array of horizontal NAND flash memory and may include a plurality of memory blocks. Each memory block BLKa may include m cell strings STR in which n memory cells MC are serially connected in the direction of bit lines BL0 to BLn−1. In a NAND flash memory device having the structure of FIG. 3, erasing is performed in units of blocks and programming is performed in units of pages corresponding to word lines WL0 to WL7. FIG. 3 illustrates an example in which n pages for n word lines WL1 to WLn are provided in one block. In addition, the non-volatile memory device 10 of FIGS. 1 and 2 may include a plurality of memory cell arrays that perform the same operation as that of the memory cell array 110 described above with the same structure as that of the memory cell array 110 described above.

Figure 4:
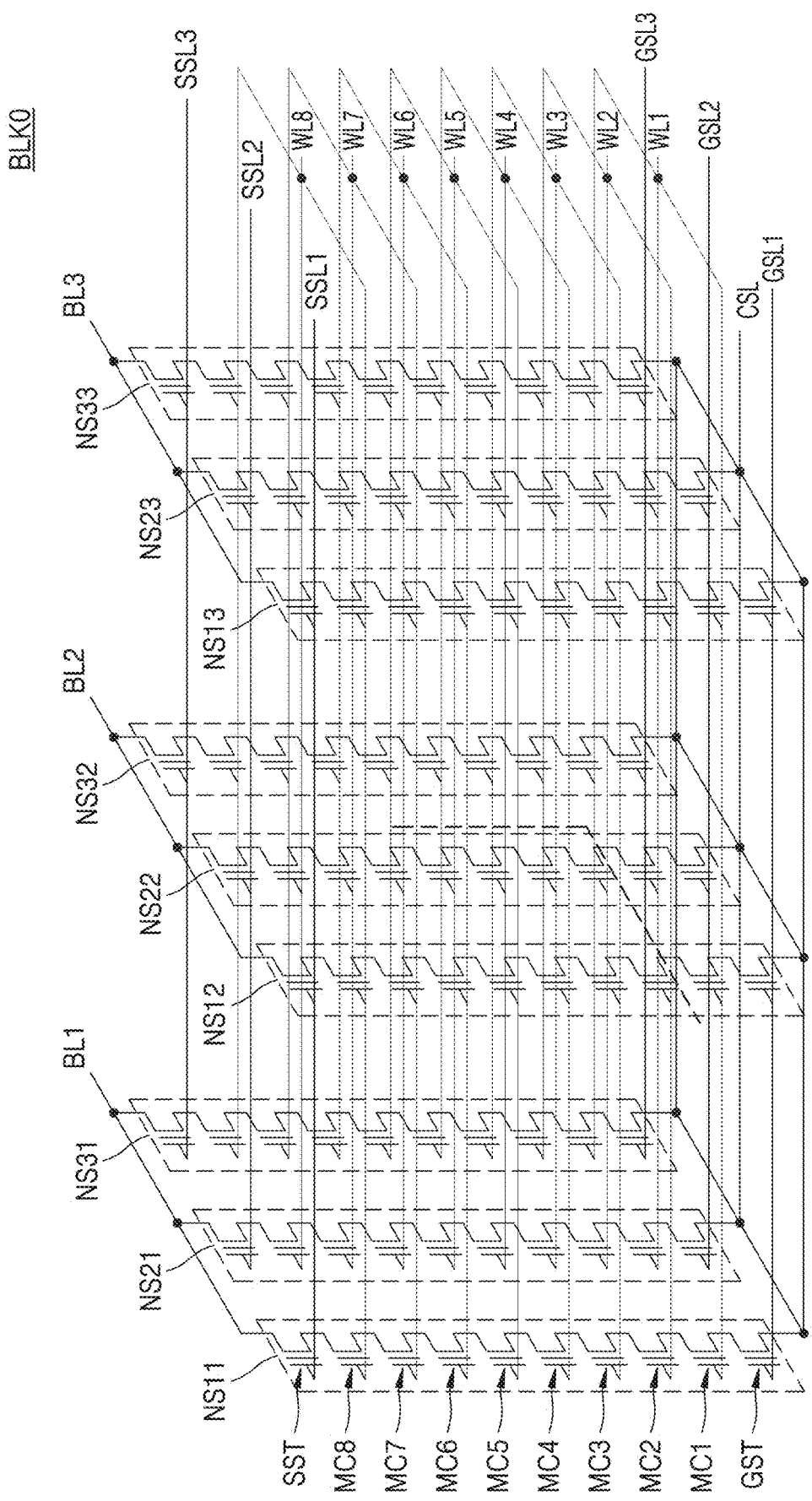
FIG. 4 is a circuit diagram illustrating another example of a memory block included in a memory cell array according to an example embodiment of the inventive concepts.

FIG. 4 is a circuit diagram illustrating another example of a memory block included in a memory cell array according to an example embodiment of the inventive concepts.

Referring to FIG. 4, the memory cell array (for example, 110 of FIG. 2) may be a memory cell array of vertical NAND flash memory and may include a plurality of memory blocks. Each memory block BLK0 may include a plurality of NAND cell strings NS11 to NS33, a plurality of word lines WL1 to WL8, a plurality of bit lines BL1 to BL3, a plurality of ground selection lines GSL1 to GSL3, a plurality of cell string selection lines SSL1 to SSL3, and a common source line CSL. Here, the number of NAND cell strings, the number of word lines, the number of bit lines, the number of ground selection lines, and the number of cell string selection lines may vary in accordance with an example embodiment.

The NAND cell strings NS11, NS21, and NS31 are provided between a first bit line BL1 and the common source line CSL. The NAND cell strings NS12, NS22, and NS32 are provided between a second bit line BL2 and the common source line CSL. The NAND cell strings NS13, NS23, and NS33 are provided between a third bit line BL3 and the common source line CSL. Each NAND cell string (for example, NS11) may include a serially connected cell string selection transistor SST, a plurality of memory cells MC1 to MC8, and a ground selection transistor GST.

The cell string selection transistor SST is connected to the corresponding cell string selection lines SSL1 to SSL3. The plurality of memory cells MC1 to MC8 are respectively connected to the corresponding word lines WL1 to WL8. The ground selection transistor GST is connected to the corresponding ground selection lines GSL1 to GSL3. The cell string selection transistor SST is connected to the corresponding bit lines BL1 to BL3 and the ground selection transistor GST is connected to the common source line CSL.

A word line (for example, WL1) of the same height is commonly connected, the cell string selection lines SSL1 to SSL3 are separate from each other, and the ground selection lines GSL1 to GSL3 are separate from each other. For example, when memory cells that are connected to the first word line WL1 and belong to the cell strings NS11, NS12, and NS13 are programmed, the first word line WL1 and the first cell string selection line SSL1 are selected. The ground selection lines GSL1 to GSL3 may be commonly connected to each other.

Figure 5:
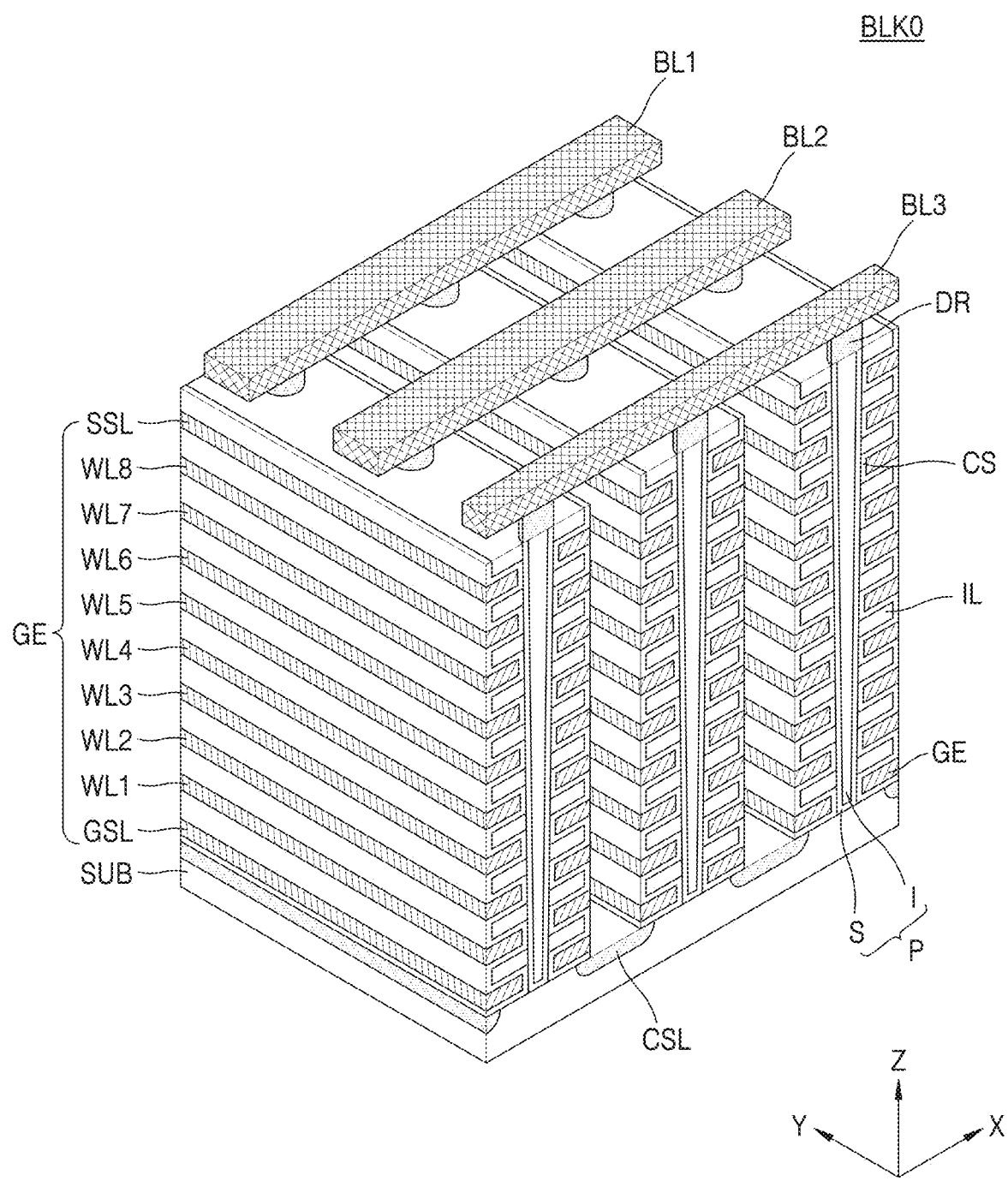
FIG. 5 is a perspective view illustrating a memory block according to an example embodiment of the inventive concepts.

FIG. 5 is a perspective view illustrating a memory block BLK0 according to an example embodiment of the inventive concepts.

Referring to FIG. 5, each memory block included in the memory cell array (for example, 110 of FIG. 2) is formed in a vertical direction with respect to a substrate SUB. In FIG. 5, it is illustrated that a memory block includes the two selection lines GSL and SSL, the 8 word lines WL1 to WL8, and the 3 bit lines BL1 to BL3. However, the memory block may include more or less selection lines, word lines, and bit lines.

The substrate SUB has a first conductivity type (for example, a p type). Common source lines CSL extending in a first direction (for example, a Y direction) and doped with impurities of a second conductivity type (for example, an n type) are provided on the substrate SUB. On a region of the substrate SUB between two adjacent common source lines CSL, a plurality of insulating layers IL extending in the first direction are sequentially provided in a third direction (for example, a Z direction) and the plurality of insulating layers IL are spaced apart from each other by a certain distance in the third direction. For example, the plurality of insulating layers IL may include an insulating material such as a silicon oxide.

On the region of the substrate SUB between the two adjacent common source lines CSL, a plurality of pillars P sequentially arranged in the first direction and passing via the plurality of insulating layers IL in the third direction are provided. For example, the plurality of pillars P pass via the plurality of insulating layers IL and contact the substrate SUB. In detail, a surface layer S of each pillar P may include a silicon material having a first type and may function as a channel region. On the other hand, an internal layer I of each pillar P may include an insulating material such as a silicon oxide or an air gap.

In the region between the two adjacent common source lines CSL, a charge storage layer CS is provided along exposed surfaces of the insulating layers IL, the pillars P, and the substrate SUB. The charge storage layer CS may include a gate insulating layer (or referred to as 'a tunneling insulting layer'), a charge trap layer, and a blocking insulating layer. For example, the charge storage layer CS may have an oxide-nitride-oxide (ONO) structure. In addition, in the region between the two adjacent common source lines CSL, on an exposed surface of the charge storage layer CS, a gate electrode GE such as the selection lines GSL and SSL and the word lines WL1 to WL8 is provided.

Drains or drain contacts DR are respectively provided on the plurality of pillars P. For example, the drains or the drain contacts DR may include a silicon material doped with impurities of the second conductivity type. On the drains DR, the bit lines BL1 to BL3 extending in a second direction (for example, an X direction) and spaced apart from each other by a certain distance in the first direction are provided.

Figure 6:
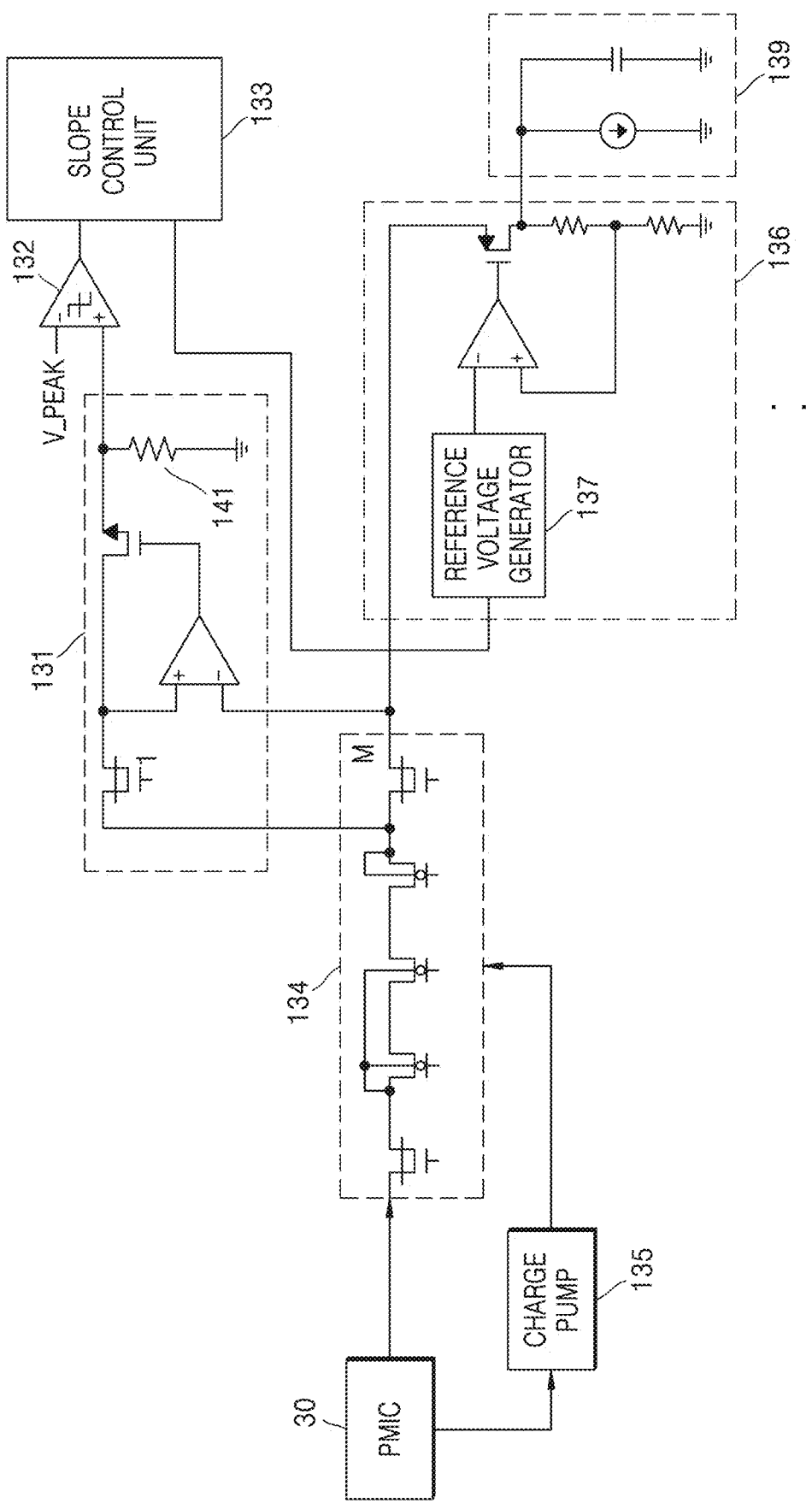
FIG. 6 is a circuit diagram illustrating a voltage generator according to an example embodiment of the inventive concepts.

FIG. 6 is a circuit diagram illustrating a voltage generator according to an example embodiment of the inventive concepts.

Referring to FIG. 6, the voltage generator 130 may include a switching circuit 134, the current sensing unit 131, the peak detect unit 132, the slope control unit 133, at least one driving circuit 136 and a word line 139.

According to an example embodiment, the switching circuit 134 may select a current source of the charge current input to the word lines WL. For example, the switching circuit 134 may be connected to the PMIC 30 positioned outside the non-volatile memory device 10. In another example, the switching circuit 134 may be connected to a charge pump 135 in the voltage generator 130. According to various example embodiments, the switching circuit 134 may select connection to the PMIC 30 or the charge pump 135 in accordance with requirement of an application of the non-volatile memory device 10. The application requirement may refer to a magnitude of a voltage and a magnitude of a current that are required to perform a plurality of commands including performance (for example, the maximum permissible current, the maximum supply power, a rectified current, or a rectified voltage) that may be provided by the PMIC 30, the data read command, the data write command, and an erase command.

According to an example embodiment, the current sensing unit 131 may be connected to the switching circuit 134. The current sensing unit 131 may copy the charge current input to the plurality of word lines via the switching circuit 134. According to various example embodiments, the current sensing unit 131 may include a current mirror circuit or a coupler for copying the charge current. The current mirror circuit or the coupler may copy the charge current input via the switching circuit 134 to a magnitude of 1/M. M may have a positive integer value. For example, M may be 1,000. Since the magnitude of the current copied by the current mirror circuit or the coupler is only 1/1,000 of the charge current, a current that does not affect charge of the word lines and determining whether the magnitude of the charge current is greater than the magnitude of the peak current may be obtained.

According to an example embodiment, the current sensing unit 131 may further include a resistor 141. The resistor 141 may be one terminal (for example, a positive input terminal) of the comparator and may be connected to a ground terminal. Since the one terminal of the comparator is equivalent to an open circuit, the charge current copied by the current mirror circuit or the coupler may flow to the ground terminal via the resistor 141. Therefore, a voltage value V_detect formed by the copied charge current flowing to the resistor 141 may be input to the one terminal of the comparator. The current sensing unit 131 may sense the magnitude of the charge current that passes via the switching circuit 134 based on the voltage value V_detect.

The peak detect unit 132 may include the comparator. The voltage value V_detect is input to the one terminal of the comparator and a peak voltage may be applied to the other terminal of the comparator. The peak voltage may have a voltage level corresponding to the peak current value. For example, the peak voltage having a voltage value V_peak for detecting the peak current may have a voltage level obtained by multiplying a value of the resistor 141 by the peak current value. An output end of the comparator may be connected to the slope control unit 133. When an output signal of the comparator is logic low or "0", the slope control unit 133 may determine that the voltage value V_detect does not coincide with the voltage value V_peak. When the output signal of the comparator is logic high or "1", the slope control unit 133 may determine that the voltage value V_detect coincides with the voltage value V_peak. In various example embodiments, the output signal of the comparator may be referred to as a peak detection signal Peak_Detect.

In the above-described example embodiment, it is described that M is 1,000. However, the inventive concepts are not limited thereto. M may be variable so long as it does not affect the magnitude of the charge current. For example, M may be 100 to 10,000.

In the above-described example embodiment, the peak current value is described as being previously determined. However, the inventive concepts are not limited thereto. In various example embodiments, the peak current value may be changed based on the application requirement. For example, when the switching circuit 134 is connected to the PMIC 30 with the large maximum allowable current value, the peak current value may increase.

The slope control unit 133 may transmit a slope control signal to the at least one driving circuit 136. Specifically, the slope control unit 133 may transmit the slope control signal to a reference voltage generator 137 included in the at least one driving circuit 136. According to various example embodiments, the slope control signal may correspond to a signal for controlling a magnitude of the reference voltage that increases per unit time.

The at least one driving circuit 136 may charge a word line 139. In various example embodiments, the word line 139 may be modelled to include a capacitor and a current source. The current source may correspond to a leakage current of a non-ideal capacitor. In various example embodiments, the at least one driving circuit 136 may include the reference voltage generator 137 and an operation amplifier 138. The reference voltage $V_{\_REF}$ formed by the reference voltage generator 137 may be provided to a negative input terminal of the operation amplifier 138.

According to an example embodiment, the reference voltage generator 137 receives a control signal from the slope control unit 133 and may change the magnitude of the reference voltage. For example, when the magnitude of the charge current is greater than the peak current value, a slope magnitude at which the reference voltage increases may be reduced. In another example, when the magnitude of the charge current is less than the peak current value, the slope magnitude at which the reference voltage increases may increase. In the above-described example embodiment, the reference voltage generator 137 is described as being included in the at least one driving circuit 136. However, the inventive concepts are not limited thereto.

In various example embodiments, the reference voltage generator 137 may be arranged outside the at least one driving circuit 136. In this case, the reference voltage may be applied to the negative input terminal of the operation amplifier 138 included in the at least one driving circuit 136.

Figure 7:
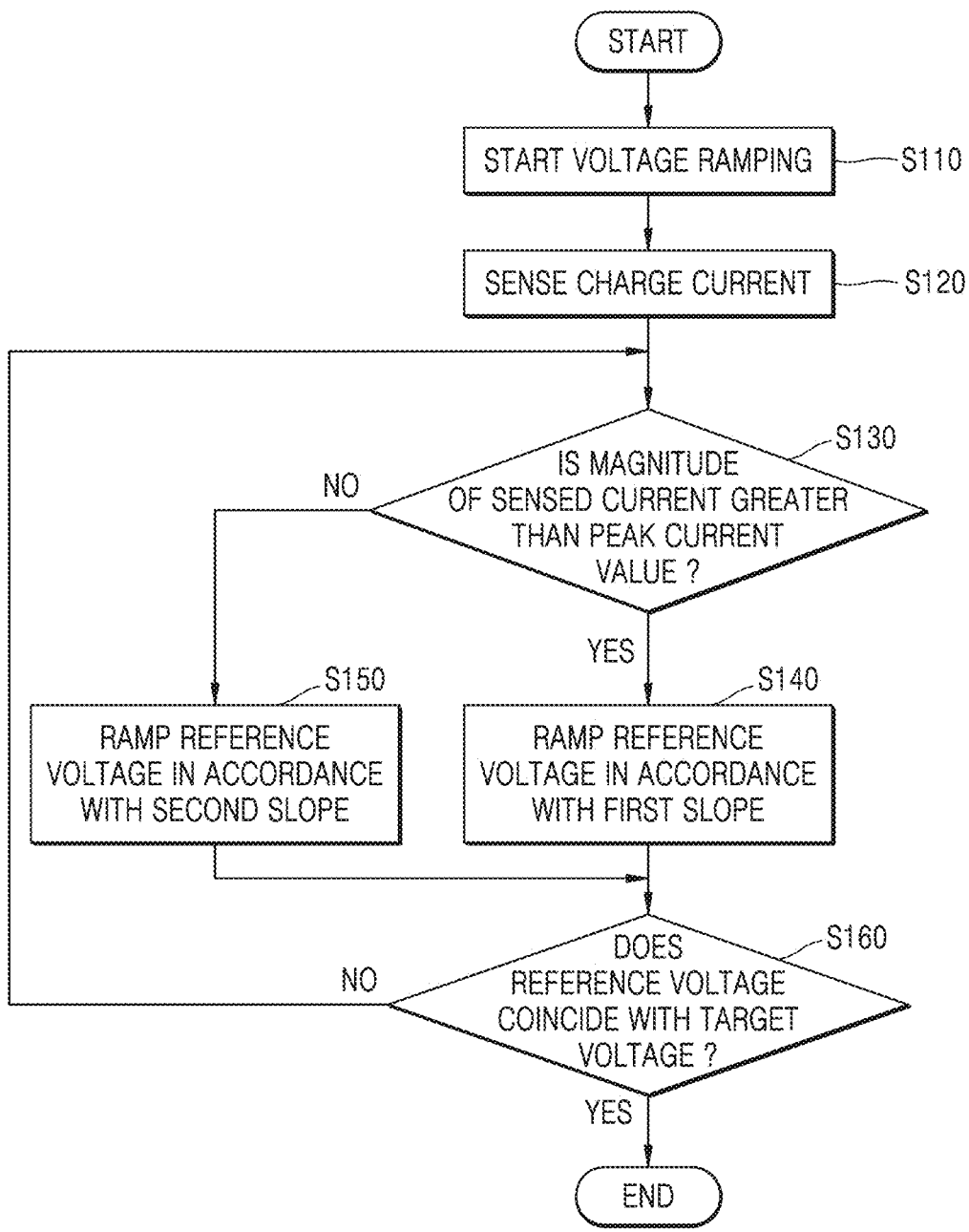
FIG. 7 is a flowchart illustrating a method of operating a voltage generator, according to an example embodiment of the inventive concepts.

FIG. 7 is a flowchart illustrating a method of operating a voltage generator, according to an example embodiment of the inventive concepts.

Referring to FIG. 7, in operation S110, the voltage generator 130 may start to ramp the word line voltage VWL. For example, the control logic 100 may transmit the voltage control signal Ctrl_vol to the voltage generator 130. The voltage generator 130 may perform voltage ramping for charging the word lines WL in response to the voltage control signal Ctrl_vol.

In operation S120, the voltage generator 130 may sense the charge current. The voltage generator 130 may activate the current sensing unit 131 in response to the voltage control signal Ctrl_vol of operation S110. For example, the current sensing unit 131 may copy the charge current that flows via the switching circuit 134 to the magnitude of ⅟₁,₀₀₀. In the above-described example embodiment, it is described that the current is copied to the magnitude of ⅟₁,₀₀₀ of the charge current. However, the inventive concepts are not limited thereto. In addition, in the above-described example embodiments, it is described that the current sensing unit 131 is activated in response to the voltage control signal Ctrl_vol. However, the inventive concepts are not limited thereto. In various example embodiments, the current sensing unit 131 may sense the charge current in response to an additional enable signal.

In operation S130, the voltage generator 130 may determine whether the sensed current is greater than the peak current. The voltage generator 130 may compare the magnitude of the sensed current with the peak current value by using the peak detect unit 132. Referring to FIG. 6 or 7, the comparator of the peak detect unit 132 may compare the voltage value V_detect generated by the sensed current flowing via the resistor 141 with the voltage value V_peak for detecting the peak current. When the voltage value V_detect is equal to the voltage value V_peak, the comparator of the peak detect unit 132 may output a high signal representing that the charge current is greater than the peak current. When the voltage value V_detect is different from the voltage value V_peak, the comparator of the peak detect unit 132 may output a low signal. Therefore, when the slope control unit 133 receives the high signal from the peak detect unit 132, it may be determined that the sensed current reaches the peak current value.

In operation S140, the voltage generator 130 may ramp the reference voltage in accordance with a first slope. When the magnitude of the sensed current is not greater than the peak current value, the slope control unit 133 may ramp the reference voltage in accordance with the first slope. When the reference voltage is ramped in accordance with the first slope, the magnitude of the charge current that is the sum of currents input to the at least one driving circuit 136 may increase.

In operation S150, the voltage generator 130 may ramp a voltage in accordance with a second slope. When the magnitude of the sensed current is greater than the peak current value, the slope control unit 133 may ramp the voltage in accordance with the second slope. The second slope may correspond to a value less than the first slope. When the reference voltage is ramped in accordance with the reduced second slope, the magnitude of the charge current that is the sum of the currents input to the at least one driving circuit 136 may be reduced.

In operation S160, the voltage generator 130 may determine whether the reference voltage is the same as a target voltage. For example, when it is determined that the word line voltage VWL is the same as a target voltage, since the word lines WL are completely charged and the magnitude of the charge current is reduced, the slope control unit 133 may stop slope control for detecting the peak current. In another example, when the word line voltage VWL is lower than the target voltage, the slope control unit 133 may perform operation S130 for determining whether the magnitude of the sensed current is greater than the peak current value again.

Figure 8:
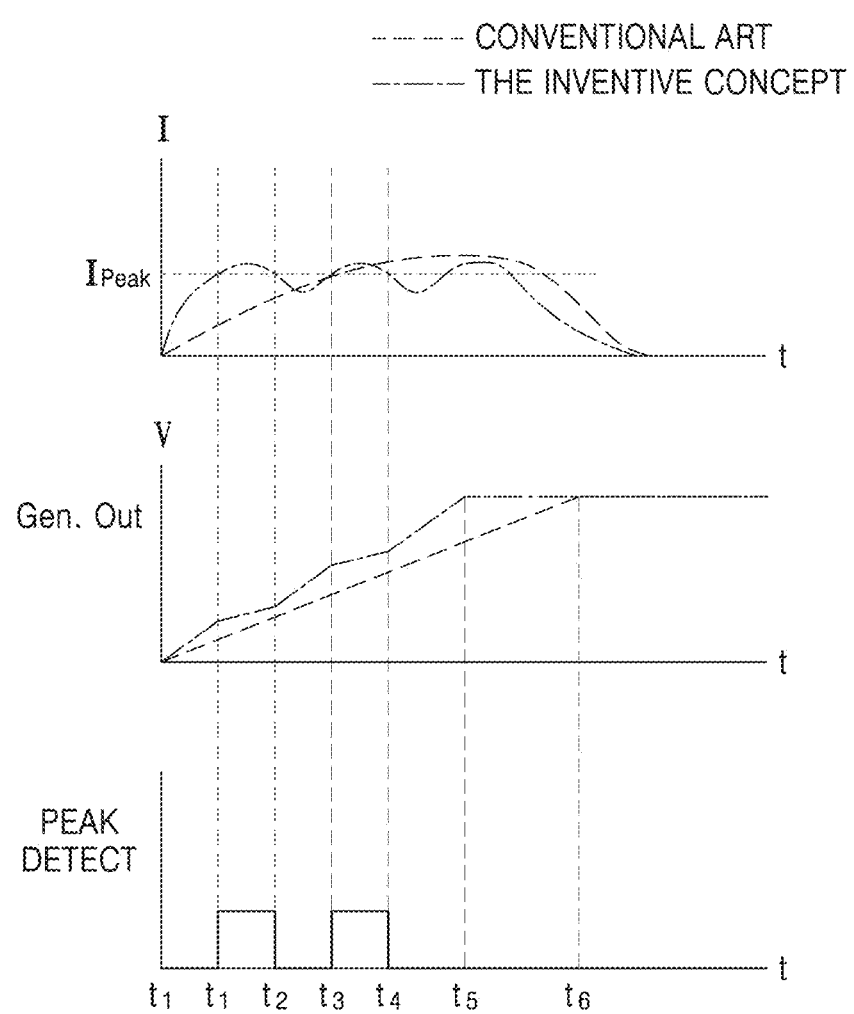
FIG. 8 is a graph illustrating a charge current and a word line voltage according to an example embodiment of the inventive concepts.

FIG. 8 is a graph illustrating a charge current and a word line voltage according to an example embodiment of the inventive concepts.

Referring to FIG. 8, in a period t0 to t1, the voltage generator 130 may ramp the word line voltage VWL. For example, the voltage generator 130 receives the voltage control signal Ctrl_vol from the control logic 100 and may determine to precharge the word lines WL. In the period t0 to t1, since the magnitude of the charge current that flows via the switching circuit 134 is less than the peak current value, the comparator of the peak detect unit 132 may output a low signal. When the low signal is input from the peak detect unit 132, the slope control unit 133 may perform control to ramp the reference voltage in accordance with the first slope. When a plurality of word line voltages are ramped in accordance with the first slope, the charge current that is the sum of the currents input to the at least one driving circuit 136 via the switching circuit 134 may drastically increase.

In a period t1 to t2, the slope control unit 133 may perform control to ramp the voltage in accordance with the second slope. A voltage value formed in a current sensed at time t1 may be equal to a voltage value for detecting the peak current. Therefore, since voltage values of both terminals of the comparator of the peak detect unit 132 are equal, a high signal may be output. When the high signal is output from the peak detect unit 132, the slope control unit 133 determines that the magnitude of the charge current that flows via the switching circuit 134 reaches the peak current value and may reduce the slope of the voltage ramping. A magnitude of the second slope may be less than a magnitude of the first slope. The slope control unit 133 may maintain the ramping of the reference voltage in accordance with the second slope until a point in time at which the low signal is received from the peak detect unit 132. Since the magnitude of the second slope is less than the magnitude of the first slope, when a plurality of word line voltages are ramped in accordance with the second slope, a magnitude of a current requested by the at least one driving circuit 136 may be less than when the reference voltage is ramped in accordance with the first slope. Therefore, the magnitude of the charge current that is the sum of the currents input to the at least one driving circuit 136 via the switching circuit 134 may be reduced.

In a period t2 to t3, the slope control unit 133 determines that the magnitude of the charge current is not greater than the peak current value and may ramp the reference voltage in accordance with the first slope. Specifically, at time t2, the slope control unit 133 may determine that the magnitude of the charge current that flows via the switching circuit 134 is reduced to be no more than the peak current value in response to the low signal received from the peak detect unit 132. Therefore, the slope control unit 133 may perform control to ramp the reference voltage in accordance with the first slope. Like in the period t0 to t1, when the reference voltage is ramped in accordance with the first slope, the magnitude of the charge current that flows via the switching circuit 134 may increase.

According to various example embodiments, when the magnitude of the charge current is greater than the peak current value, the slope control unit 133 may perform control so that the magnitude of the charge current is less than the peak current value by ramping the reference voltage in accordance with the second slope. When the magnitude of the charge current is less than the peak current value, the slope control unit 133 may rapidly ramp the word line voltage VWL until a point in time at which the magnitude of the charge current is greater than the peak current value by ramping the reference voltage in accordance with the first slope.

According to various example embodiments, when the slope for ramping the reference voltage is variably controlled by the slope control unit 133, the time spent on reaching the target voltage may correspond to t5. On the other hand, in a conventional method in which the charge current of which the magnitude is not greater than the peak current value is generated and the reference voltage is ramped in accordance with a fixed slope, the time spent on reaching the target voltage may be t6. That is, a standby time for driving the word lines WL may be reduced by t5 from t6 without the magnitude of the charge current being greater than the peak current value by variably controlling the slope for ramping the reference voltage.

In the above-described example embodiments, it is described that the slope control unit 133 increases the reference voltage in accordance with the first slope or the second slope. However, the inventive concepts are not limited thereto. According to various example embodiments, the slope control unit 133 may vary a slope value in a clock mode or a sensing level mode.

According to various example embodiments, in the clock mode, the slope is changed based on a reference clock signal. For example, the slope control unit 133 may operate based on timings of a rising edge and a falling edge of a clock signal. For example, the slope control unit 133 may count a reference clock from a point in time at which the high signal is received from the peak detect unit 132. The slope control unit 133 may control the reference voltage that increases in accordance with the first slope to increase in accordance with the second slope in response to the received high signal. The slope control unit 133 may count a previously determined number of times of the reference clock from a point in time at which the high signal is received. For example, the previously determined number of times may correspond to 10. When the reference clock passes 10 times from the point in time at which the high signal is received, the slope control unit 133 may additionally change the slope value of the reference voltage. For example, the slope control unit 133 may increase the reference voltage in accordance with a third slope. The third slope may correspond to a value less than the second slope.

According to various example embodiments, in the sensing level mode, the slope is changed based on a plurality of peak current values. The voltage generator 130 may include a plurality of comparators. The plurality of comparators may respectively detect the plurality of peak current values. Although not shown, a first peak detect unit detects a first current level, a second peak detect unit detects a second current level, and a third peak detect unit detects a third current level. The second current level may have a greater value than the first current level and the third current level may have a greater value than the second current level. The slope control unit 133 may control the reference voltage that increases in accordance with the first slope to increase in accordance with the second slope in response to the high signal received from the first peak detect unit. The second slope may correspond to a less value than the first slope. Then, when the charge current continuously increases and the magnitude of the charge current is greater than a second peak current value, the slope control unit 133 may receive a high signal from the second peak detect unit. In this case, the slope control unit 133 may control the reference voltage that increases in accordance with the second slope to increase in accordance with the third slope. The third slope may have a less value than the second slope. Like the second peak detect unit, when a high signal is received from the third peak detect unit, the slope control unit 133 may control the reference voltage that increases in accordance with the third slope to increase in accordance to a fourth slope.

Figure 9A:
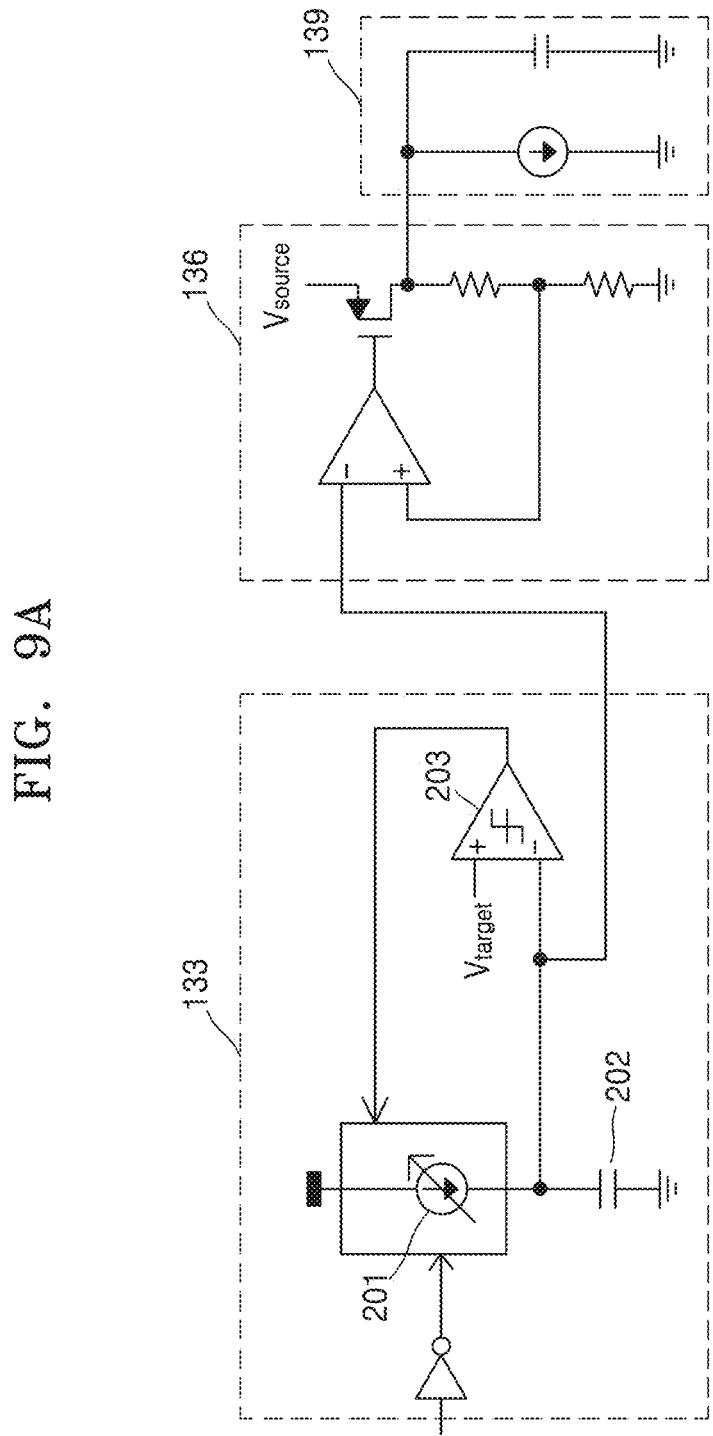
FIG. 9A is a circuit diagram illustrating an example of a slope control unit according to an example embodiment of the inventive concepts.

FIG. 9A is a circuit diagram illustrating an example of a slope control unit according to an example embodiment of the inventive concepts.

Referring to FIG. 9A, the slope control unit 133 may include a current source 201, a capacitor 202, and a comparator 203. The current source 201 may independently output a current. According to an example embodiment, the current source 201 may change the magnitude of the output current based on a signal received from the peak detect unit 132. The output current may be referred to as a bias current. For example, when a signal representing that the magnitude of the charge current is greater than the peak current value is received from the peak detect unit 132, the current source 201 may reduce the magnitude of the output current. In another example, when a signal representing that the magnitude of the charge current is less than the peak current value is received from the peak detect unit 132, the current source 201 may increase the magnitude of the output current.

The capacitor 202 may form the reference voltage by using the bias current. Since an input terminal of the comparator 203 is equivalent to an open circuit, the bias current output from the current source 201 may pass via the capacitor 202. Since the bias current passes via the capacitor 202, charges may be charged in the capacitor 202 and a voltage may be formed. The formed voltage may be input to the at least one driving circuit 136 as the reference voltage.

According to an example embodiment, the comparator 203 may form a feedback loop. The feedback loop may include an electrical path from an output terminal of the comparator 203 to the current source 201, an electrical path from the current source 201 to the capacitor 202, and an electrical path from the capacitor 202 to the input terminal of the comparator 203. According to an example embodiment, the comparator 203 determines whether the reference voltage is the same as the target voltage and may output the slope control signal. For example, when the reference voltage is the same as the target voltage, the output terminal may output a low signal. In accordance with the feedback loop, the low signal may be fed back to the current source 201. The current source 201 that receives the low signal may maintain an output of the current. In another example, when the reference voltage reaches the target voltage, the comparator 203 may output a high signal. In accordance with the feedback loop, the high signal may be fed back to the current source 201. When the high signal is received, the current source 201 may stop outputting the bias current.

Figure 9B:
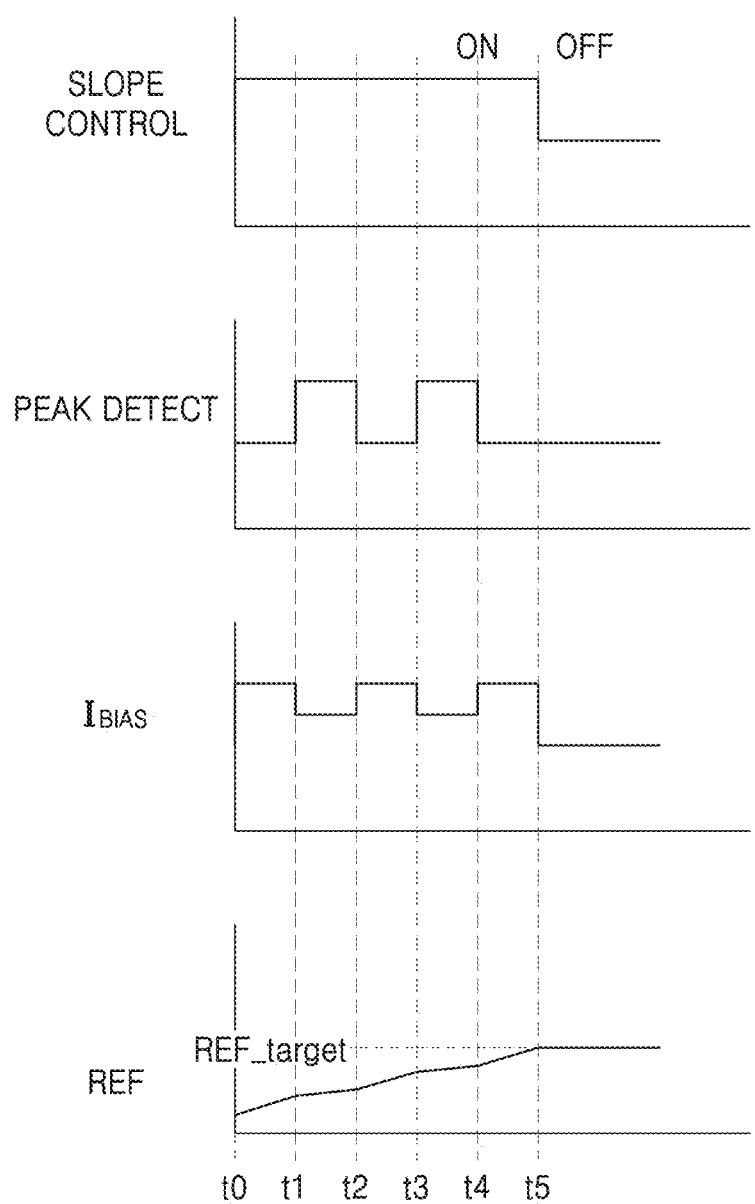
FIG. 9B is a graph illustrating a charge current and a word line voltage according to an example embodiment of the inventive concepts.

FIG. 9B is a graph illustrating a charge current and a word line voltage according to an example embodiment of the inventive concepts.

Referring to FIG. 9B, at time t0, the slope control signal may be enabled. The current source 201 may output the bias current in response to the slope control signal. The bias current may have a first magnitude. As illustrated above in FIG. 10A, the output bias current may pass via only the capacitor 202 without being applied to the comparator 203 equivalent to the open circuit. In the period t0 to t1, since the bias current having the first magnitude passes via the capacitor 202, charges are charged in the capacitor 202 and the reference voltage that increases in accordance with the first slope may be formed. The first slope may have the same magnitude as the first magnitude of the bias current. The reference voltage that increases in accordance with the first slope may be applied to the at least one driving circuit 136. As an increase ratio of the reference voltage increases, a magnitude of a current that flows to a word line connected to the at least one driving circuit 136 may also increase. Since the charge current that passes through the switching circuit 134 is the sum of currents input to the plurality of word lines, the charge current may rapidly increase.

At the time t1, the peak detection signal Peak_Detect may be enabled. The magnitude of the charge current that rapidly increases in the period t0 to t1 may be greater than the peak current value. The peak detect unit 132 may transmit the peak detection signal Peak_Detect representing that the magnitude of the charge current that passes via the switching circuit 134 is greater than the peak current value to the current source 201. The current source 201 may reduce an output of the bias current at the time t1. For example, the current source 201 may output a current of a second magnitude less than the first magnitude. In the period t1 to t2, since the bias current of the second magnitude passes through the capacitor 202, charges are charged in the capacitor 202 and the reference voltage that increases in accordance with the second slope may be formed. The second slope may have a magnitude equal to the first magnitude of the bias current. The reference voltage that increases in accordance with the second slope may be applied to the at least one driving circuit 136. In comparison with the reference voltage that increases in accordance with the first slope, since the increase ratio of the reference voltage that increases in accordance with the second slope is reduced, the magnitude of the current that flows to the word line connected to the at least one driving circuit 136 may be reduced. In this case, since the charge current that passes via the switching circuit 134 is the sum of the currents input to the plurality of word lines, the magnitude of the charge current may be also reduced.

At the time t2, the peak detection signal Peak_Detect may be disabled. The charge current reduced in the period t1 to t2 may be reduced to no more than the peak current value. The peak detect unit 132 may represent that the magnitude of the charge current that passes via the switching circuit 134 is reduced to no more than the peak current value by disabling the peak detection signal Peak_Detect. The current source 201 may increase the output of the bias current at the time t2. For example, the current source 201 may output the bias current of the first magnitude. The description of the period t2 to t3 may be as the description of the period t0 to t1. The description of a period t3 to t4 may be as the description of the period t1 to t2.

At time t5, the slope control signal may be disabled. Referring to FIG. 9A, the comparator 203 may perform an operation of comparing the reference voltage with the target voltage. When the reference voltage is the same as the target voltage at the time t5, the output terminal of the comparator 203 may output a high signal. When the current source 201 receives the high signal from the output terminal of the comparator 203 that forms the feedback loop, the current source 201 may stop outputting the bias current. When the bias current is not output, additional charges may not be charged in the capacitor 202. Since previously charged charges exist in the capacitor 202, the reference voltage that reaches the target voltage may be uniformly maintained.

According to various example embodiments, the slope control unit 133 may inactivate the current sensing unit 131. For example, after the time t5, the charge current may be rapidly reduced. When it is determined that the reference voltage coincides with the target voltage, the slope control unit 133 may determine whether a current of a previously determined value is detected. When the current of the previously determined value is detected, the slope control unit 133 may determine that the word lines WL are completely charged and accordingly, the charge current is stabilized. Therefore, the slope control unit 133 may inactivate the current sensing unit 131.

Figure 10A:
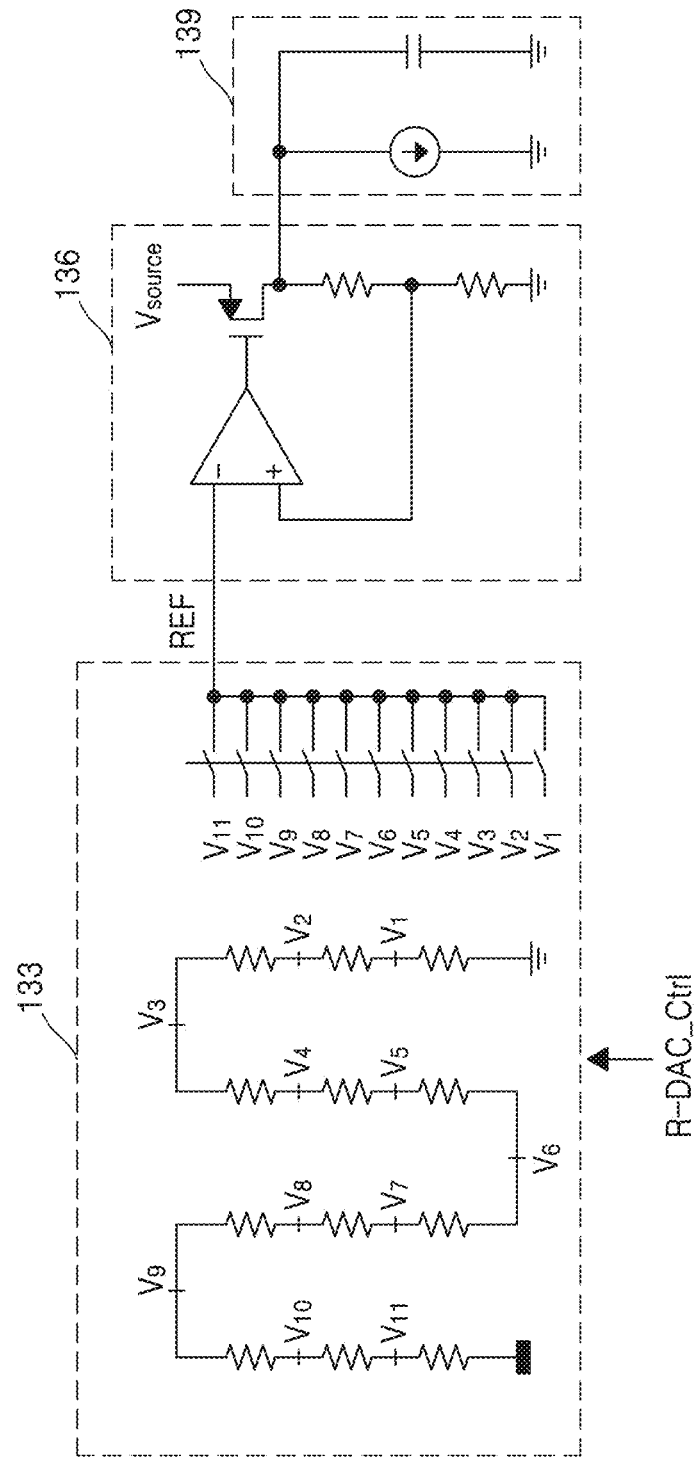
FIG. 10A is a circuit diagram illustrating another example of a slope control unit according to an example embodiment of the inventive concepts.

FIG. 10A is a circuit diagram illustrating another example of a slope control unit 133 according to an example embodiment of the inventive concepts.

Referring to FIG. 10A, the slope control unit 133 may include a resistor-digital analog converter (R-DAC).

In various example embodiments, the R-DAC may include a plurality of voltage nodes respectively corresponding to a plurality of voltage levels. The plurality of voltage nodes may respectively correspond to the plurality of voltage levels based on voltage distribution performed by a plurality of resistors connected among ground nodes. For example, referring to FIG. 11A, the R-DAC may include 15 resistors. A first voltage may be applied to a first node. In various example embodiments, the R-DAC may include a plurality of switches respectively corresponding to a plurality of nodes.

In various example embodiments, the control logic (100 of FIG. 2) may control the plurality of switches included in the R-DAC. The control logic 100 may select an R-DAC output voltage by transmitting an R-DAC control signal. The R-DAC output voltage may be input to the at least one driving circuit 136 as the reference voltage. According to an example embodiment, when a signal representing that the magnitude of the charge current is not greater than the peak current value is received from the peak detect unit 132, the control logic 100 may control the plurality of switches in order to apply the reference voltage that increases in accordance with the first slope. Since the plurality of nodes of the R-DAC respectively correspond to discrete voltage values, the control logic 100 may increase a switching distance to correspond to the reference voltage that increases in accordance with the first slope. For example, the control logic 100 may sequentially switch the first node, a third node, a fifth node, a seventh node, and a ninth node.

The increased switching distance may correspond to the reference voltage that increases in accordance with the first slope by using the bias current of the first magnitude in FIG. 10A. According to another example embodiment, when a signal representing that the magnitude of the charge current is greater than the peak current value is received from the peak detect unit 132, the control logic 100 may control the plurality of switches in order to apply the reference voltage that increases in accordance with the second slope. Since the plurality of nodes of the R-DAC respectively correspond to the discrete voltage values, the control logic 100 may reduce the switching distance to correspond to the reference voltage that increases in accordance with the second slope. For example, the control logic 100 may sequentially switch the first node, a second node, a third node, a fourth node, and a fifth node. The reduced switching distance may correspond to the reference voltage that increases in accordance with the second slope by using the bias current of the second magnitude in FIG. 9A.

Figure 10B:
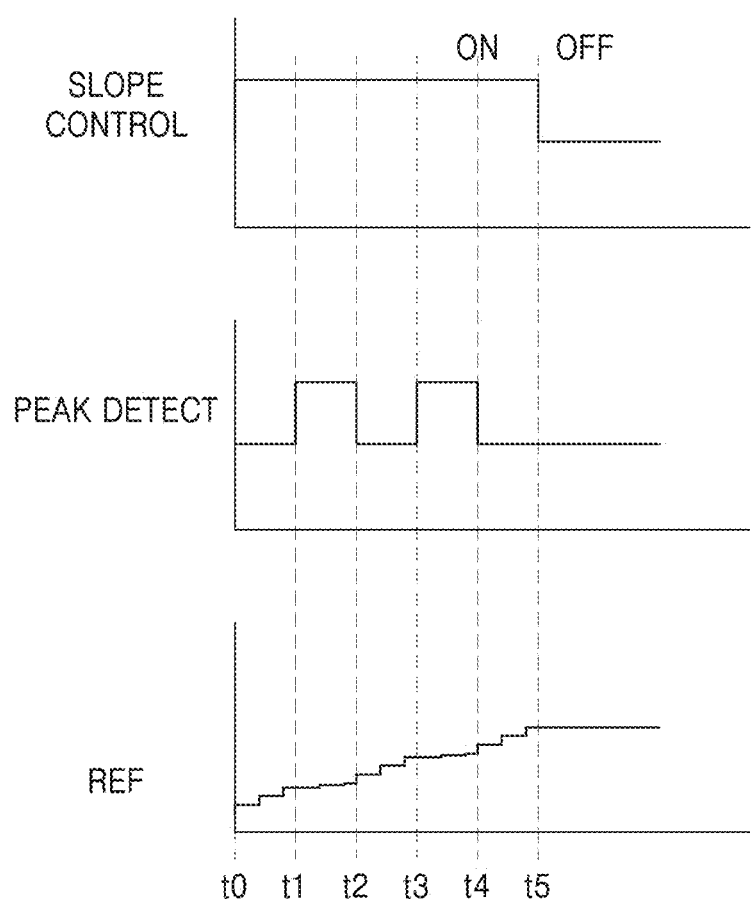
FIG. 10B is a graph illustrating a charge current and a word line voltage according to an example embodiment of the inventive concepts.

FIG. 10B is a graph illustrating a charge current and a word line voltage according to an example embodiment of the inventive concepts.

Referring to FIG. 10B, at the time to, the slope control signal may be enabled. The control logic 100 may transmit the R-DAC control signal to the voltage generator 130 in response to the slope control signal. For example, the R-DAC may sequentially switch the first node, the third node, and the fifth node. In accordance with the switching, a first voltage, a third voltage, and a fifth voltage respectively corresponding to the first node, the third node, and the fifth node may be input as reference voltages. Since a change ratio of the reference voltage is a positive value, the magnitude of the charge current that passes via the switching circuit 134 may increase.

At the time t1, the peak detection signal Peak_Detect may be enabled. The magnitude of the charge current that rapidly increases in the period t0 to t1 may be greater than the peak current value. The peak detect unit 132 may transmit the peak detection signal Peak_Detect representing that the magnitude of the charge current that passes via the switching circuit 134 is greater than the peak current value to the control logic 100. The control logic 100 may transmit a control signal for reducing the switching distance of the R-DAC to the R-DAC. The R-DAC may reduce a voltage switching distance. For example, the R-DAC may sequentially switch the fifth node, a sixth node, and the seventh node. In accordance with the switching, the fifth voltage, a sixth voltage, and a seventh voltage respectively corresponding to the fifth node, the sixth node, and the seventh node may be input as reference voltages. In response to reduction in the change ratio of the reference voltage, the magnitude of the current that flows to the word line connected to the at least one driving circuit 136 may be reduced. In this case, since the charge current that passes via the switching circuit 134 is the sum of the currents input to the plurality of word lines, the magnitude of the charge current may be also reduced.

At the time t2, the peak detection signal Peak_Detect may be disabled. In the period t1 to t2, the magnitude of the charge current may be reduced to be no more than the peak current value. The peak detect unit 132 may represent that the magnitude of the charge current that passes via the switching circuit 134 is reduced to no more than the peak current value by disabling the peak detection signal Peak_Detect. The control logic 100 may transmit a control signal for instructing the R-DAC to increase the switching distance. The R-DAC may increase the voltage switching distance. For example, the R-DAC may sequentially switch the seventh node, the ninth node, and an eleventh node.

According to the switching, the seventh voltage, a ninth voltage, and an eleventh voltage respectively corresponding to the seventh node, the ninth node, and the eleventh node may be input as reference voltages. In response to the increase in change ratio of the reference voltage, the magnitude of the current that flows to the word line connected to the at least one driving circuit 136 may increase. In this case, since the magnitude of the charge current that passes via the switching circuit 134 is the sum of the currents input to the plurality of word lines, the magnitude of the charge current may increase again. The description of the period t2 to t3 is the same as the description of the period t0 to t1. The description of the period t3 to t4 is the same as the description of the period t1 to t2.

At the time t5, the slope control signal may be disabled. Detailed description of FIG. 10B may be as the description of the time t5 of FIG. 9B.

Figure 11A:
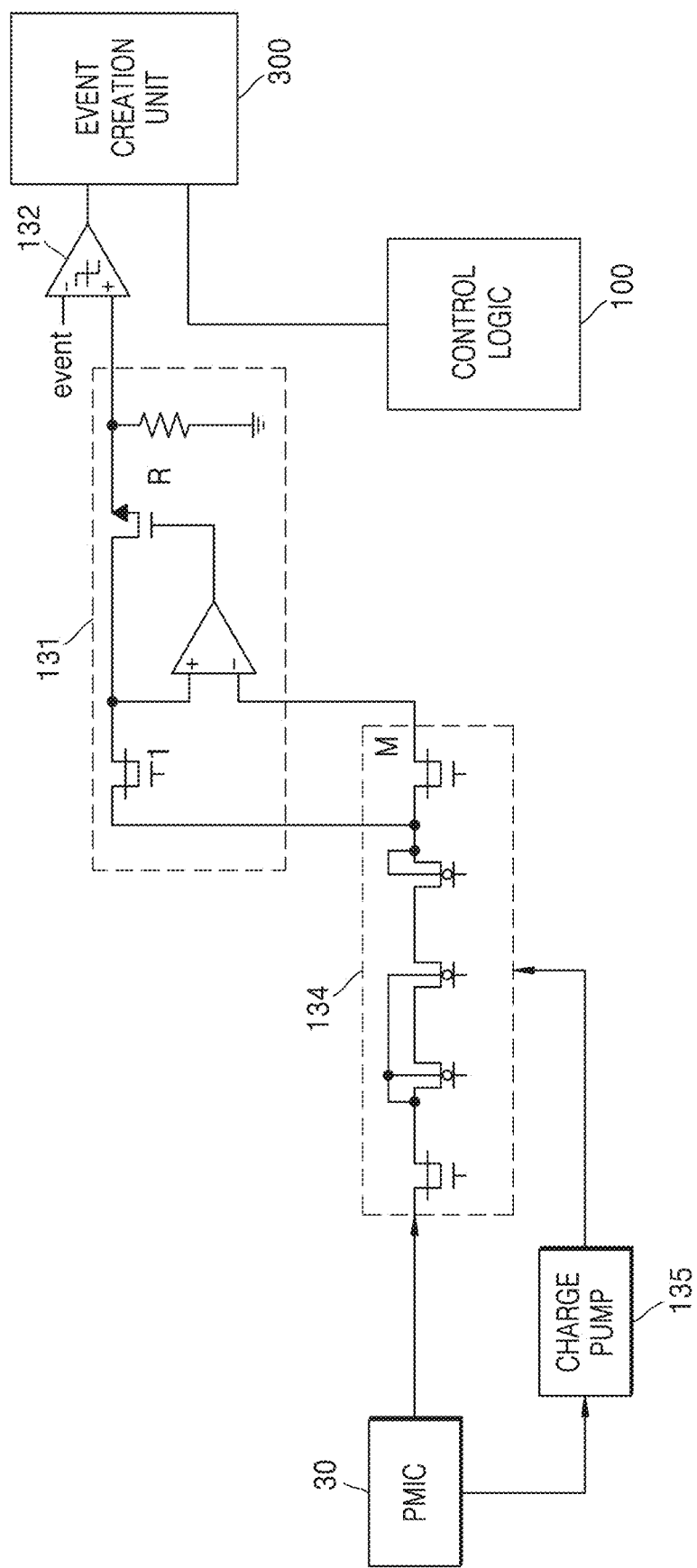
FIG. 11A is a circuit diagram illustrating a voltage generator including an event detector according to an example embodiment of the inventive concepts.

FIG. 11A is a circuit diagram illustrating a voltage generator 130 including an event creation unit 300 according to an example embodiment of the inventive concepts.

Referring to FIG. 11A, the voltage generator 130 may include the PMIC 30, the switching circuit 134, the charge pump 135, the current sensing unit 131, the peak detect unit 132, and the event creation unit 300. Although not shown, the voltage generator 130 may include the at least one driving circuit 136 illustrated in FIG. 6, the reference voltage generator 137, the operation amplifier 138, and the word line 139. The event creation unit 300 may receive a value obtained by sensing the charge current from the current sensing unit 131. The event creation unit 300 may generate a signal for instructing a word line charge event based on the received sensing value.

According to an example embodiment, the event creation unit 300 may compare the received sensing value with a previously determined current value. The previously determined current value may refer to the magnitude of the charge current reduced to sufficiently assume that the word line 139 reaches the target voltage. As a word line voltage value approaches a target voltage value, since the magnitude of the charge current for increasing the word line voltage is reduced, when the sensing value of the charge current received from the current sensing unit 131 is equal to the previously determined current value, the event creation unit 300 may determine that the word line 139 reaches the target voltage.

When the sensing value equal to the previously determined current value is received, the event creation unit 300 may transmit an event creation signal to the control logic 100. Since the word line 139 is completely charged, in response to the event creation signal received from the event creation unit 300, the control logic 100 may perform control to process a next process.

Figure 11B:
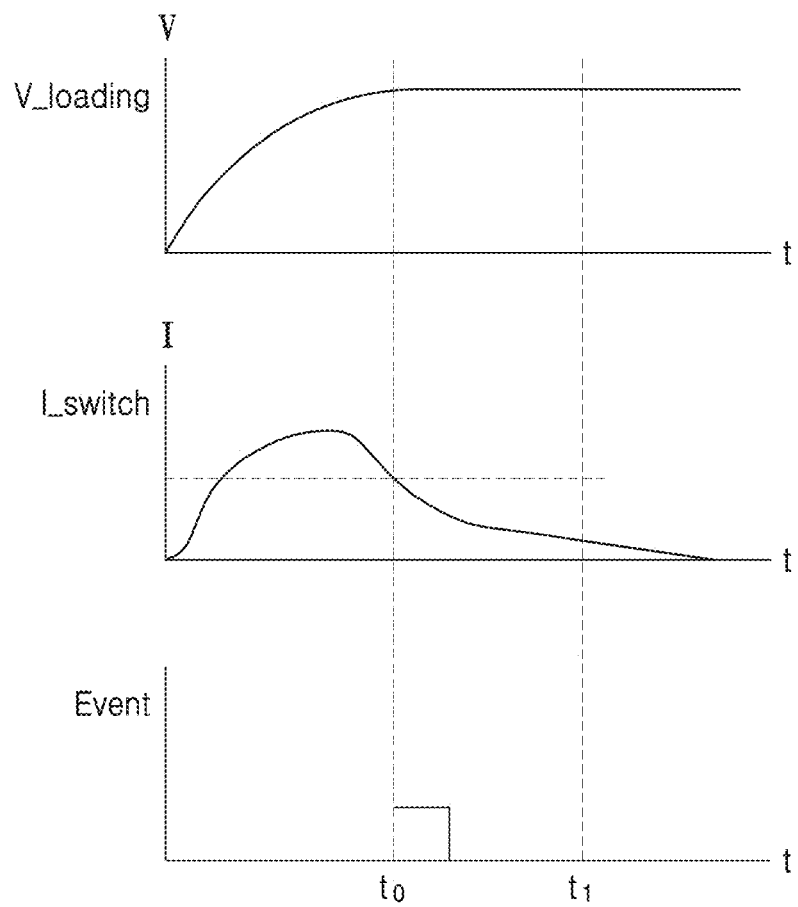
FIG. 11B is a graph illustrating a point in time at which an event is generated according to an example embodiment of the inventive concepts.

FIG. 11B is a graph illustrating a point in time at which an event is generated according to an example embodiment of the inventive concepts.

Referring to FIG. 11B, the event creation unit 300 may determine whether an event is generated based on the sensing value received from the current sensing unit 131. The event may represent that the word line 139 is completely charged.

At the time t0, the event creation unit 300 may determine that the magnitude of the charge current received from the current sensing unit 131 is equal to a previously determined current value. In response to determination that the magnitude of the charge current is equal to the previously determined current value, the event creation unit 300 may transmit the event creation signal to the control logic 100. In response to the event creation signal, the control logic 100 may perform control to perform various commands including the data read command and the data write command by using the completely charged word line 139.

The time t1 may refer to the smallest time spent on the control logic 100 standing by in order to charge the word line 139 in a conventional art. When the charge current is not measured in real time, the control logic 100 may perform control to perform various commands after waiting for the time t1 at which it may be assumed that the word line 139 is completely charged. Therefore, the event creation unit 300 according to the above-described example embodiment may transmit the event creation signal to the control logic 100 at t0 that is a point in time at which the word line 139 is actually charged without waiting for the word line 139 to be charged until t1 by determining the magnitude of the charge current received from the current sensing unit 131. Therefore, the control logic 100 may reduce the standby time for driving the word line 139 and improve performance by performing the operation (for example, the data read operation or the data write operation) in accordance with the input command without waiting until the time t1.

Figure 12:
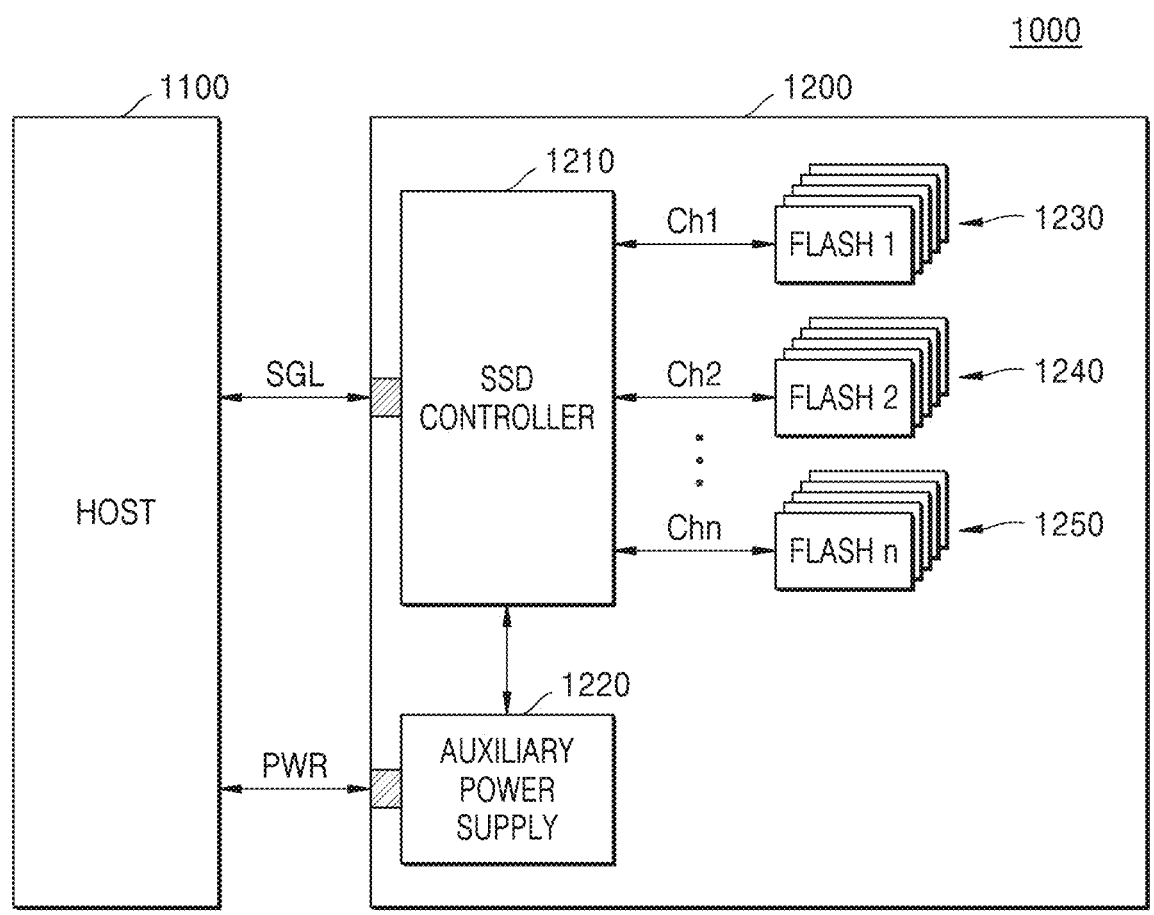
FIG. 12 is a block diagram illustrating an example in which each of memory devices according to example embodiments of the inventive concepts is applied to a solid state drive (SSD) system.

FIG. 12 is a block diagram illustrating an example in which a memory device according to example embodiments of the inventive concepts is applied to a solid state drive (SSD) system 1000.

Referring to FIG. 12, the SSD system 1000 may include a host 1100 and an SSD 1200. The SSD 1200 transmits a signal to and receives a signal from the host 1100 via a signal connector and receives power via a power connector. The SSD 1200 may include an SSD controller 1210, an auxiliary power supply 1220, and a plurality of memory devices 1230, 1240, and 1250. At this time, at least one of the plurality of memory devices 1230, 1240, and 1250 may be implemented by using the example embodiments illustrated in FIGS. 1 to 11B. The SSD controller 1210 may be implemented within the SSD 1200 as hardware or software or in the form of a combination of hardware and software.

Specifically, the non-volatile memory device 10 of FIG. 2 may be applied to at least one of the plurality of memory devices 1230, 1240, and 1250. Therefore, when the magnitude of the charge current for charging the word line 139 is greater than the peak current value, at least one of the plurality of memory devices 1230, 1240, and 1250 may increase the reference voltage in accordance with the second slope. When the magnitude of the charge current for charging the word line 139 is not greater than the peak current value, at least one of the plurality of memory devices 1230, 1240, and 1250 may increase the reference voltage in accordance with the first slope.

Therefore, shut down or malfunction of the SSD 1200 may be prevented by controlling the magnitude of the charge current not to be greater than the peak current value and charging the word line 139. In addition, the time spent on increasing the word line voltage to the target voltage may be reduced in comparison with a case in which the reference voltage is increased in accordance with a fixed slope by rapidly increasing the reference voltage in accordance with the first slope in a period in which the magnitude of the charge current is not greater than the peak current value.

The memory device according to the example embodiment of the inventive concepts may be mounted in or applied to a memory card system, a computing system, or the UFS as well as the SSD 1200. In addition, a method of operating the memory device according to the example embodiment of the inventive concepts may be applied to each of various kinds of electronic systems in which the non-volatile memory device is mounted.

While the inventive concepts has been particularly shown and described with reference to example embodiments thereof, it will be understood that various changes in form and details may be made therein without departing from the spirit and scope of the following claims.

What is claimed is:

1. A voltage generator comprising:
   at least one driving circuit connected to a plurality of word lines of a memory device, the at least one driving circuit configured to provide a current for increasing voltages of the plurality of word lines based on a reference voltage;
   a current sensing circuit configured to detect a magnitude of a charge current input to the at least one driving circuit;
   a peak detect circuit configured to compare the detected magnitude of the charge current with a peak current value; and
   a slope control circuit configured to
     provide the reference voltage to the at least one driving circuit,
     increase the reference voltage in accordance with a first slope when the detected magnitude of the charge current is less than or equal to the peak current value, and
     increase the reference voltage in accordance with a second slope less than the first slope when the detected magnitude of the charge current is greater than the peak current value.

2. The voltage generator of claim 1, further comprising:
   a switch configured to select a power management integrated circuit (PMIC) or a charge pump,
   wherein the charge current is input from the PMIC or the charge pump to the at least one driving circuit via the switch.

3. The voltage generator of claim 2,
wherein the current sensing circuit comprises a feedback loop, the feedback loop including a mirror circuit configured to copy a current having a magnitude of M/1 of the magnitude of the charge current input to the at least one driving circuit via the current sensing circuit or an operation amplifier, and
wherein M is a positive integer.

4. The voltage generator of claim 1,
wherein the slope control circuit comprises a current source and a capacitor,
wherein the slope control circuit reduces a magnitude of a current output from the current source to charge the capacitor when the detected magnitude of the charge current is less than or equal to the peak current value and increases a magnitude of a current output from the current source to charge the capacitor when the detected magnitude of the charge current is greater than the peak current value, and
wherein the capacitor is charged based on the current output from the current source to form the reference voltage.

5. The voltage generator of claim 1,
wherein the slope control circuit comprises a plurality of switches connected to a plurality of nodes, respectively, and a resistor-digital analog converter (R-DAC) for outputting a voltage of one among the plurality of nodes as the reference voltage in response to a switching signal, the plurality of nodes corresponding to a plurality of voltages, respectively, and
wherein the slope control circuit is configured to
    increase a switching distance by which a voltage among the plurality of voltages corresponding to one among the plurality of nodes is output when the detected magnitude of the charge current is less than or equal to the peak current value, and
    reduce a switching distance by which another voltage among the plurality of voltages corresponding to another among the plurality of nodes is output when the detected magnitude of the charge current is greater than the peak current value.

6. The voltage generator of claim 1, wherein the slope control circuit is configured to
measure an output voltage of the at least one driving circuit, and
inactivate the current sensing circuit when the measured output voltage coincides with a target voltage.

7. The voltage generator of claim 1, wherein the slope control circuit is configured to
operate based on timings of a rising edge and a falling edge of a clock signal, or
operate based on a sensing level obtained by the current sensing circuit.

8. The voltage generator of claim 1, wherein the peak current value changes based on requirement of an application.

9. The voltage generator of claim 1, wherein the slope control circuit is configured to inactivate the current sensing circuit when the magnitude of the charge current obtained by the current sensing circuit is no more than a previously determined magnitude.

10. The voltage generator of claim 1,
wherein the current sensing circuit is configured to
    determine whether the detected magnitude of the charge current coincides with a previously determined magnitude, and
    transmit an event creation signal to a control logic when the detected magnitude of the charge current coincides with a previously determined magnitude, and
wherein the event creation signal instructs a pending next process to be started.

11. A method of operating a voltage generator, the method comprising:
providing a reference voltage;
sensing a magnitude of a charge current for increasing voltages of a plurality of word lines based on the reference voltage;
determining whether the sensed magnitude of the charge current is greater than a peak current value;
increasing the reference voltage in accordance with a first slope when the sensed magnitude of the charge current is less than or equal to the peak current value; and
increasing the reference voltage in accordance with a second slope less than the first slope when the detected magnitude of the charge current is greater than the peak current value.

12. The method of claim 11, further comprising:
selecting a power management integrated circuit (PMIC) or a charge pump as a current source by using a switching circuit,
wherein the sensing of the magnitude of the charge current further comprises copying a current having a magnitude of M/1 of the magnitude of the charge current using a mirror circuit,
wherein M is a positive integer.

13. The method of claim 11,
wherein the voltage generator comprises a current source for outputting a current and a capacitor charged by using a current output from the current source to form the reference voltage,
wherein the increasing of the reference voltage in accordance with the first slope comprises increasing a magnitude of a current output from the current source, and
wherein the increasing of the reference voltage in accordance with the second slope comprises reducing a magnitude of a current output from the current source.

14. The method of claim 11,
wherein the voltage generator comprises a plurality of switches connected to a plurality of nodes, respectively, and a resistor-digital analog converter (R-DAC) for outputting a voltage of one among the plurality of nodes as the reference voltage in response to a switching signal, the plurality of nodes corresponding to a plurality of voltages, respectively,
wherein the increasing of the reference voltage in accordance with the first slope comprises increasing a switching distance by which a voltage among the plurality of voltages corresponding to one of the plurality of voltages is output, and
wherein the increasing of the reference voltage in accordance with the second slope comprises reducing a switching distance by which another voltage among the plurality of voltages corresponding to another of the plurality of voltages is output.

15. The method of claim 11, further comprising:
determining whether the reference voltage coincides with a target voltage; and
bypassing an operation of sensing the magnitude of the charge current when the reference voltage coincides with the target voltage.

16. The method of claim 11, wherein the applying of the reference voltage that increases in accordance with the first slope and the applying the reference voltage that increases in accordance with the second slope operate based on timings of a rising edge and a falling edge of a clock signal or operate based on a sensing level obtained by a current sensing circuit.

17. The method of claim 11, wherein the peak current value changes based on requirement of an application.

18. The method of claim 11, further comprising:
inactivating a current sensing circuit when the magnitude of the charge current is no more than a previously determined magnitude.

19. The method of claim 11, further comprising:
determining whether the detected magnitude of the charge current coincides with a previously determined magnitude; and
transmitting an event creation signal to a control logic when the detected magnitude of the charge current coincides with the previously determined magnitude,
wherein the event creation signal represents that a voltage of a word line reaches a target voltage.

20. A non-volatile memory device, comprising:
a memory cell array;
a row decoder connected to the memory cell array via a plurality of word lines; and
a voltage generator configured to,
    detect a magnitude of a charge current input to at least one driving circuit connected to the plurality of word lines,
    compare the detected magnitude of the charge current with a peak current value,
    provide a reference voltage to the at least one driving circuit,
    increase the reference voltage in accordance with a first slope in response to the detected magnitude of the charge current being less than or equal to the peak current value, and
    increase the reference voltage in accordance with a second slope less than the first slope in response to the detected magnitude of the charge current being greater than the peak current value.

* * * * *